United States Patent
Pletka et al.

(10) Patent No.: US 10,699,791 B2
(45) Date of Patent: Jun. 30, 2020

(54) ADAPTIVE READ VOLTAGE THRESHOLD CALIBRATION IN NON-VOLATILE MEMORY

(71) Applicant: INTERNATIONAL BUSINESS MACHINES CORPORATION, Armonk, NY (US)

(72) Inventors: Roman A. Pletka, Uster (CH); Nikolaos Papandreou, Thalwil (CH); Sasa Tomic, Kilchberg (CH); Nikolas Ioannou, Zurich (CH); Charalampos Pozidis, Thalwil (CH); Timothy Fisher, Cypress, TX (US); Aaron D. Fry, Richmond, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/111,804

(22) Filed: Aug. 24, 2018

(65) Prior Publication Data

US 2020/0066353 A1   Feb. 27, 2020

(51) Int. Cl.
*G11C 16/26* (2006.01)
*G06F 3/06* (2006.01)
(Continued)

(52) U.S. Cl.
CPC .......... *G11C 16/26* (2013.01); *G06F 3/0604* (2013.01); *G06F 3/0632* (2013.01);
(Continued)

(58) Field of Classification Search
CPC ...................................................... G11C 16/26
(Continued)

(56) References Cited

U.S. PATENT DOCUMENTS 7,616,499 B2   11/2009   Wan et al.
8,422,303 B2   4/2013   Franca-Neto et al.
(Continued)

FOREIGN PATENT DOCUMENTS

CN   101419843   4/2009
CN   102880554   12/2013
(Continued)

OTHER PUBLICATIONS

Yaakobi et al., "Error Characterization and Coding Schemes for Flash Memory", describes bit-level BER, page-level BER measurements and a proposed error correcting scheme (see section III B-C and section IV). 2010 https://cseweb.ucsd.edu/~swanson/papers/ACTEMT2010ECC.pdf.
(Continued)

*Primary Examiner* — Min Huang
(74) *Attorney, Agent, or Firm* — Brian F. Russell; Gail Zarick

(57) ABSTRACT

A non-volatile memory includes a plurality of physical pages each assigned to one of a plurality of page groups. A controller of the non-volatile memory performs a first calibration read of a sample physical page of a page group of the non-volatile memory. The controller determines if an error metric observed for the first calibration read of the sample physical page satisfies a calibration threshold. The controller calibrates read voltage thresholds of the page group utilizing a first calibration technique based on a determination that the error metric satisfies the calibration threshold and calibrates read voltage thresholds of the page group utilizing a different second calibration technique based on a determination that the error metric does not satisfy the calibration threshold.

19 Claims, 10 Drawing Sheets

(51) Int. Cl.
*G11C 16/34* (2006.01)
*G06F 11/07* (2006.01)
*G11C 16/04* (2006.01)

(52) U.S. Cl.
CPC .......... *G06F 3/0659* (2013.01); *G06F 3/0679* (2013.01); *G06F 11/073* (2013.01); *G06F 11/076* (2013.01); *G11C 16/0483* (2013.01); *G11C 16/3427* (2013.01); *G11C 16/3495* (2013.01)

(58) Field of Classification Search
USPC .................................................. 714/E11.055
See application file for complete search history.

(56) References Cited

U.S. PATENT DOCUMENTS

| | | | |
|---|---|---|---|
| 8,579,986 B1 | 11/2013 | Freeman et al. | |
| 8,990,485 B2 | 3/2015 | Haukness et al. | |
| 9,069,688 B2 | 6/2015 | Chung et al. | |
| 9,176,859 B2 | 11/2015 | Walston et al. | |
| 9,361,167 B2 | 6/2016 | Kealy et al. | |
| 9,530,522 B1 | 12/2016 | Christensen et al. | |
| 9,563,504 B2 | 2/2017 | Liang et al. | |
| 9,576,671 B2 | 2/2017 | Karakulak et al. | |
| 9,772,901 B2 | 9/2017 | Hoekstra et al. | |
| 9,805,809 B1 | 10/2017 | Zhou et al. | |
| 9,857,986 B2 | 1/2018 | Fisher et al. | |
| 10,082,962 B2 | 9/2018 | Fisher et al. | |
| 10,121,551 B1* | 11/2018 | Miller | G11C 16/3431 |
| 10,140,040 B1 | 11/2018 | Koudele et al. | |
| 10,170,162 B2 | 1/2019 | Al-Shamma et al. | |
| 10,170,195 B1 | 1/2019 | Ioannou et al. | |
| 10,236,067 B2 | 3/2019 | Fisher et al. | |
| 10,453,537 B1* | 10/2019 | Reuter | G11C 29/028 |
| 10,552,063 B2 | 2/2020 | Pletka et al. | |
| 2007/0263444 A1 | 11/2007 | Gorobets et al. | |
| 2008/0133288 A1 | 6/2008 | Thibaux et al. | |
| 2009/0319859 A1 | 12/2009 | Alrod et al. | |
| 2010/0023800 A1 | 1/2010 | Harari et al. | |
| 2011/0007562 A1 | 1/2011 | Yip | |
| 2012/0226959 A1 | 9/2012 | Xie et al. | |
| 2013/0111113 A1 | 5/2013 | Harari et al. | |
| 2014/0056067 A1 | 2/2014 | Zhang et al. | |
| 2014/0164880 A1 | 6/2014 | Chen et al. | |
| 2014/0229799 A1 | 8/2014 | Hubris et al. | |
| 2015/0332788 A1* | 11/2015 | Bellorado | G11C 11/5642 714/719 |
| 2016/0041891 A1 | 2/2016 | Malshe et al. | |
| 2016/0103630 A1 | 4/2016 | Shen | |
| 2016/0110124 A1 | 4/2016 | Camp et al. | |
| 2016/0110248 A1 | 4/2016 | Camp et al. | |
| 2016/0110249 A1 | 4/2016 | Orme et al. | |
| 2016/0170672 A1 | 6/2016 | Li et al. | |
| 2016/0179412 A1 | 6/2016 | Camp et al. | |
| 2017/0003880 A1 | 1/2017 | Fisher et al. | |
| 2017/0091006 A1 | 3/2017 | Camp et al. | |
| 2017/0161142 A1 | 6/2017 | Reed et al. | |
| 2017/0185463 A1* | 6/2017 | Kim | G06F 11/076 |
| 2017/0220416 A1 | 8/2017 | Yao | |
| 2017/0236588 A1* | 8/2017 | Kim | G11C 16/10 365/185.12 |
| 2017/0263311 A1* | 9/2017 | Cometti | G11C 29/52 |
| 2017/0358365 A1 | 12/2017 | Ray et al. | |
| 2018/0033490 A1* | 2/2018 | Marelli | G06F 11/076 |
| 2018/0190362 A1 | 7/2018 | Barndt et al. | |
| 2018/0341413 A1 | 11/2018 | Lai et al. | |
| 2018/0374549 A1 | 12/2018 | Padilla et al. | |
| 2019/0066802 A1* | 2/2019 | Malshe | G11C 16/0483 |
| 2019/0155749 A1 | 5/2019 | Hahn et al. | |
| 2019/0172542 A1 | 6/2019 | Miladinovic | |
| 2019/0180829 A1* | 6/2019 | Chen | G11C 29/021 |

FOREIGN PATENT DOCUMENTS

| | | |
|---|---|---|
| CN | 105718206 | 6/2016 |
| EP | 2549482 A1 | 1/2013 |
| EP | 2587362 A3 | 8/2013 |
| WO | 2014088682 A1 | 6/2014 |
| WO | 2018022807 A1 | 2/2018 |

OTHER PUBLICATIONS

A. Prodromakis et al., "MLC NAND Flash memory: Aging effect and chip/channel emulation", 2015, describe measuring BER (see document). https://pdfs.semanticscholar.org/8407/bf47ed375c28a05bd2bb1a9f9c8f4d00cbe3.pdf.

Fang et al.; "Efficient Bit Error Rate Estimation for High-Speed Link by Bayesian Model Fusion", 2015 Design, Automation & Test in Europe Conference & Exhibition, pp. 1024-1029(see as copied attached).

Weis et al.; "Retention Time Measurements and Modeling of Bit Error Rates of WIDE I/O DRAM in MPSoCs", 2015 Design, Automation & Test in Europe Conference & Exhibition, pp. 495-500 (see as copied attached).

Jimenez et al.; "Phoenix: Reviving MLC Blocks as SLC to Extend NAND Flash Devices Lifetime", 2013 (see as copied attached).

Fatadin, Irshaad et al.; "Calibration of Estimated BER From Vector Magnitude With Carrier Phase Recovery", Scientific Pages Photonics Opt 1(1):1-6, 2017 (see as copied attached).

Cai et al.; "Error Analysis and Retention-Aware Error Management for NAND Flash Memory", Intel Technology Journal, vol. 17, Issue 1, 2013 (see as copied attached).

Pletka, Roman A. et al; "Health-Binning: Maximizing the Performance and the Endurance of Consumer-Level NAND Flash." Proceedings of the 9th ACM International on Systems and Storage Conference. ACM, 2016.

Appendix P.

* cited by examiner

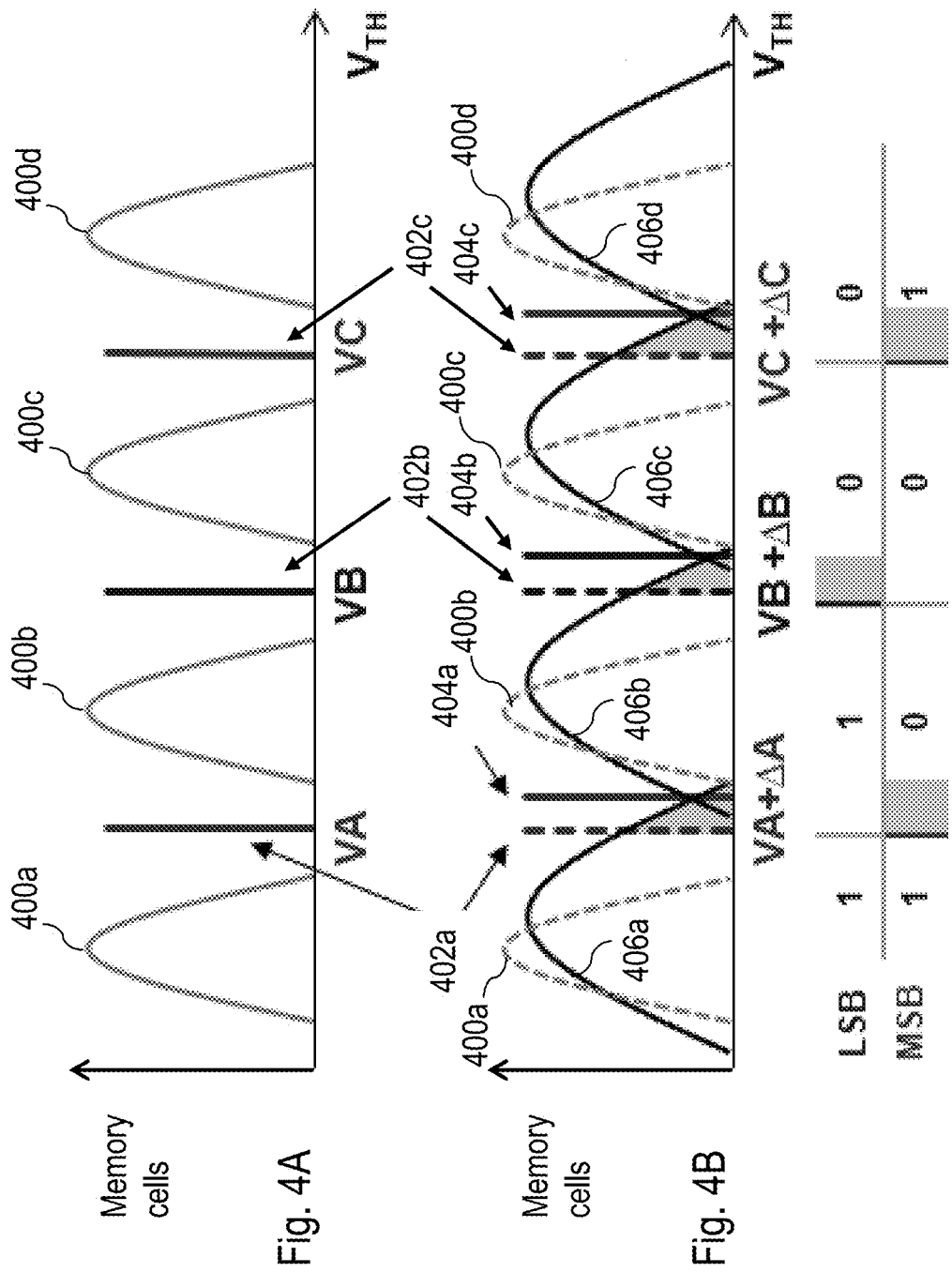

ADAPTIVE READ VOLTAGE THRESHOLD CALIBRATION IN NON-VOLATILE MEMORY

BACKGROUND OF THE INVENTION

This disclosure relates to data processing and data storage, and more specifically, to calibration of read voltage thresholds in a non-volatile memory system. Still more particularly, the disclosure relates to adaptive read voltage threshold calibration in a non-volatile memory system.

NAND flash memory is an electrically programmable and erasable non-volatile memory technology that stores one or more bits of data per memory cell as a charge on the floating gate of a transistor or a similar charge trap structure. The amount of charge on the floating gate modulates the threshold voltage of the transistor. By applying a proper read voltage and measuring the amount of current, the programmed threshold voltage of the memory cell can be determined and thus the stored information can be detected. Memories storing one, two, three and four bits per cell are respectively referred to in the art as Single Level Cell (SLC), Multi-Level Cell (MLC), Three Level Cell (TLC), and Quad Level Cell (QLC) memories. In a typical implementation, a NAND flash memory array is organized in blocks (also referred to as "erase blocks") of physical memory, each of which includes multiple physical pages each in turn containing a multiplicity of memory cells. By virtue of the arrangement of the word and bit lines utilized to access memory cells, flash memory arrays have generally been programmed on a page basis, but erased on a block basis.

In multi-level (i.e., MLC, TLC and QLC) NAND flash memory, information is stored by programming the memory cells to various quantized threshold voltage levels according to the device's programming algorithm, which maps the binary bit values to discrete threshold voltage levels. In response to a page read command, the binary bit values are retrieved by applying appropriate read voltages that divide the programmed threshold voltage window into discrete regimes and by then applying a reverse mapping between the detected threshold voltage levels and the corresponding binary bit values. Over the lifetime of a multi-level NAND flash memory device, the distributions of programmed threshold voltage generally become degraded due to the effects of wear, retention, and read disturbs on the memory cells. Consequently, it is generally desirable to adapt or calibrate the read voltage thresholds defining the various bit values over time to compensate for the effects of wear and to extend the useful life of the NAND memory device.

BRIEF SUMMARY

In conventional NAND flash memory devices, the read voltage thresholds of each physical page are calibrated on the same iterative schedule. For example, a conventional controller of a NAND flash memory device may walk through all pages of the NAND flash memory device within a time period of one to two weeks. The present application recognizes that while this calibration frequency may provide satisfactory error rates for older flash technologies, such as 2D (planar) NAND flash memory, newer non-volatile technologies, such as 3D TLC or QLC NAND flash, can require more frequent calibration, particularly when operating in elevated temperature environments. For example, in some cases, to maintain acceptable error rates, some non-volatile memory technologies may require read voltage thresholds to be calibrated on the order of hours or days rather than weeks.

As one specific example, consider the calibration of a 3D TLC NAND flash memory, where the read voltage threshold of each wordline is separately calibrated. Assuming 192 wordlines, seven read voltage thresholds (to define the eight possible cell states of TLC NAND), and three reads per read voltage threshold calibration, approximately 4,000 pages would have to be read for each calibration (e.g., 192×7× 3≈4,000). Assuming that each read takes 100 microseconds, one calibration might take 0.4 second. If the 3D TLC NAND flash memory includes 100,000 blocks and each block is sequentially calibrated once per day, the calibration would take 40,000 seconds, which at about 11 hours would consume almost half the total internal bandwidth of the memory system doing only calibrations. Obviously, for memory systems including a larger number of blocks, calibration of all blocks within the desired time frame would become impossible.

In view of foregoing, the present application recognizes that it would be useful and desirable to reduce the number of calibration reads required to perform read voltage threshold calibrations while still performing calibration frequently enough to obtain acceptable bit error rates. The present application accordingly presents techniques that can be selectively applied to reduce the number of reads performed for read voltage threshold calibration.

In one exemplary embodiment, a non-volatile memory includes a plurality of physical pages each assigned to one of a plurality of page groups. A controller of the non-volatile memory performs a first calibration read of a sample physical page of a page group of the non-volatile memory. The controller determines if an error metric observed for the first calibration read of the sample physical page satisfies a calibration threshold. The controller calibrates read voltage thresholds of the page group utilizing a first calibration technique based on a determination that the error metric satisfies the calibration threshold and calibrates read voltage thresholds of the page group utilizing a different second calibration technique based on a determination that the error metric does not satisfy the calibration threshold.

BRIEF DESCRIPTION OF THE SEVERAL VIEWS OF THE DRAWINGS

FIGS. 4A-4B depict initial and subsequent programmed threshold voltage distributions for an exemplary multi-level cell (MLC) NAND flash memory;

DETAILED DESCRIPTION

Figure 1A:
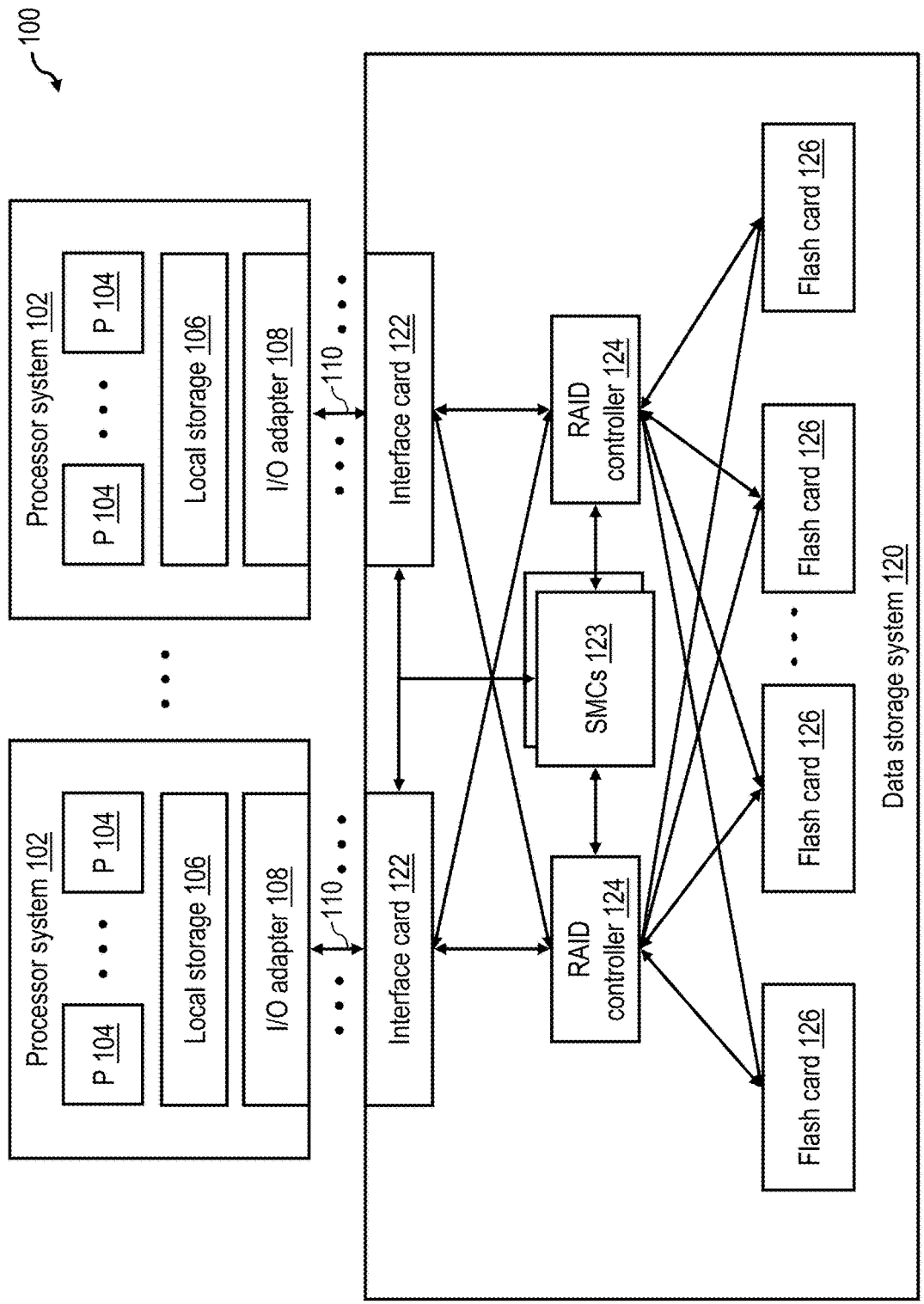
FIG. 1A is a high level block diagram of a data processing environment in accordance with one embodiment.

With reference to the figures and with particular reference to FIG. 1A, there is illustrated a high level block diagram of an exemplary data processing environment 100 including a data storage system 120 having a non-volatile memory array as described further herein. As shown, data processing environment 100 includes one or more hosts, such as a processor system 102 having one or more processors 104 that process instructions and data. A processor system 102 may additionally include local storage 106 (e.g., dynamic random access memory (DRAM) or disks) that may store program code, operands and/or execution results of the processing performed by processor(s) 104. In various embodiments, a processor system 102 can be, for example, a mobile computing device (such as a smartphone or tablet), a laptop or desktop personal computer system, a server computer system (such as one of the POWER series of servers available from International Business Machines Corporation), or a mainframe computer system. A processor system 102 can also be an embedded processor system using various processors such as ARM, POWER, Intel x86, or any other processor combined with memory caches, memory controllers, local storage, I/O bus hubs, etc.

Each processor system 102 further includes an input/output (I/O) adapter 108 that is coupled directly (i.e., without any intervening device) or indirectly (i.e., through at least one intermediate device) to a data storage system 120 via an I/O channel 110. In some embodiments, data storage system 120 may be integral to a processor system 102. In various embodiments, I/O channel 110 may employ any one or a combination of known or future developed communication protocols, including, for example, Fibre Channel (FC), FC over Ethernet (FCoE), Internet Small Computer System Interface (iSCSI), InfiniBand, Transport Control Protocol/Internet Protocol (TCP/IP), Peripheral Component Interconnect Express (PCIe), etc. I/O requests communicated via I/O channel 110 include read requests by which a processor system 102 requests data from data storage system 120 and write requests by which a processor system 102 requests storage of data in data storage system 120.

Although not required, in the illustrated embodiment, data storage system 120 includes multiple interface cards 122 through which data storage system 120 receives and responds to I/O requests of hosts via I/O channels 110. Each interface card 122 is coupled to each of multiple Redundant Array of Inexpensive Disks (RAID) controllers 124 in order to facilitate fault tolerance and load balancing. Each of RAID controllers 124 is in turn coupled (e.g., by a PCIe bus) to non-volatile storage media, which in the illustrated example include multiple flash cards 126 bearing NAND flash memory. In other embodiments, alternative and/or additional non-volatile storage devices can be employed.

In the depicted embodiment, the operation of data storage system 120 is managed by redundant system management controllers (SMCs) 123, which are coupled to interface cards 122 and RAID controllers 124. In various embodiments, system management controller 123 can be implemented utilizing hardware or hardware executing firmware and/or software.

Figure 1B:
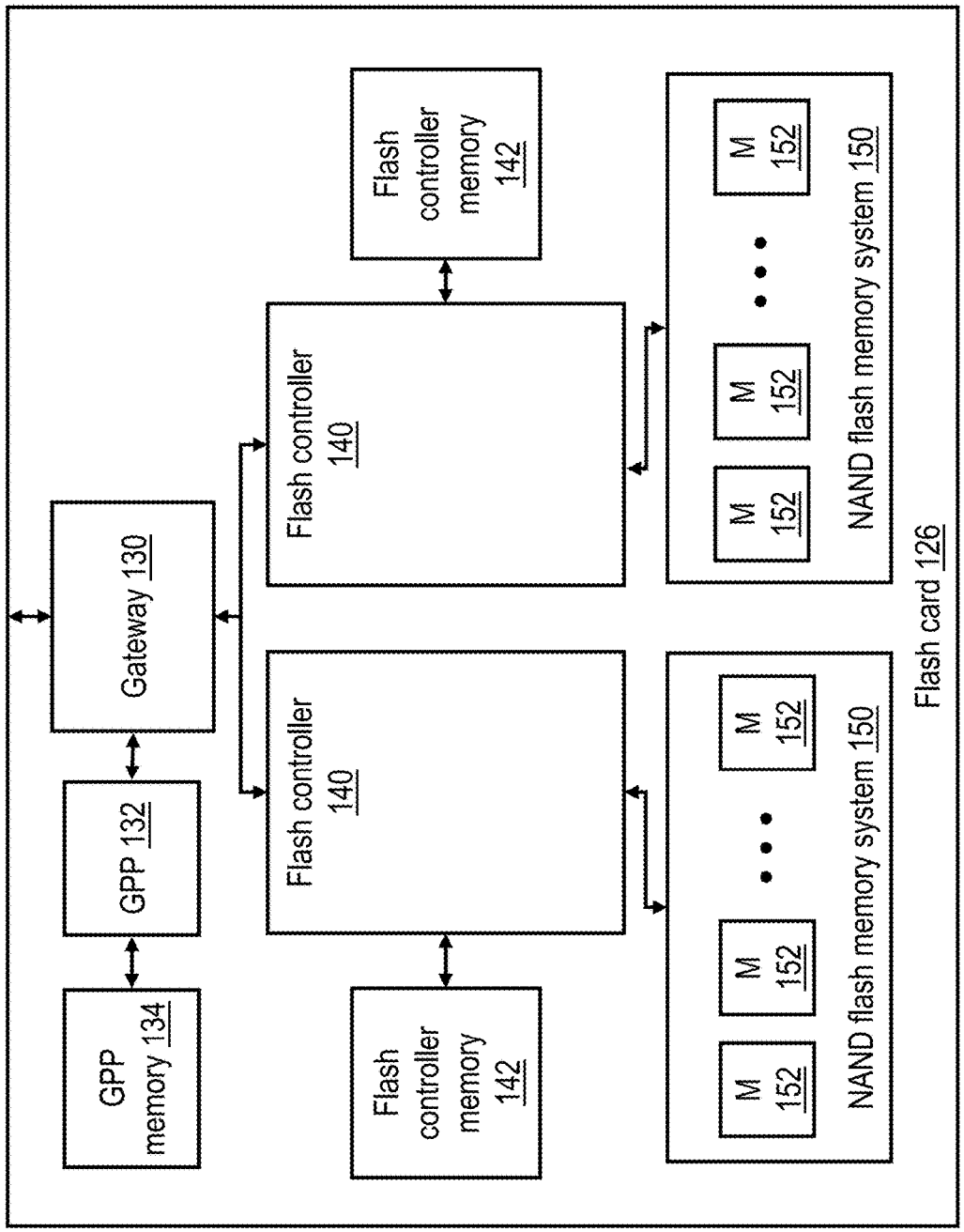
FIG. 1B is a more detailed block diagram of a flash card of the data storage system of FIG. 1A.

FIG. 1B depicts a more detailed block diagram of an exemplary embodiment of a flash card 126 of data storage system 120 of FIG. 1A. Flash card 126 includes a gateway 130 that serves as an interface between flash card 126 and RAID controllers 124. Gateway 130 is coupled to a general-purpose processor (GPP) 132, which can be configured (e.g., by program code) to perform pre-processing on requests received by gateway 130 and/or to schedule servicing of the requests by flash card 126. GPP 132 is coupled to a GPP memory 134 (e.g., Dynamic Random Access Memory (DRAM)) that can conveniently buffer data created, referenced and/or modified by GPP 132 in the course of its processing or data flowing through the gateway 130 destined for one or more of the flash controllers 140.

Gateway 130 is further coupled to multiple flash controllers 140, each of which controls a respective NAND flash memory system 150. Flash controllers 140 can be implemented, for example, by an Application Specific Integrated Circuit (ASIC) and/or a Field Programmable Gate Array (FPGA) and/or a microprocessor, and each have an associated flash controller memory 142 (e.g., DRAM). In embodiments in which flash controllers 140 are implemented with an FPGA, GPP 132 may program and configure flash controllers 140 during start-up of data storage system 120. After startup, in general operation flash controllers 140 receive read and write requests from gateway 130 that request to read data stored in NAND flash memory system 150 and/or to store data in NAND flash memory system 150. Flash controllers 140 service these requests, for example, by accessing NAND flash memory system 150 to read or write the requested data from or into NAND flash memory system 150 or by accessing a memory cache (not illustrated) associated with NAND flash memory system 150.

Flash controllers 140 implement a flash translation layer (FTL) that provides logical-to-physical address translation to enable access to specific memory locations within NAND flash memory systems 150. In general, a request received by flash controller 140 from a host device, such as a processor system 102, contains the logical block address (LBA) at which the data is to be accessed (read or written) and, if a write request, the write data to be stored to data storage system 120. The request may also specify the amount (or size) of the data to be accessed. Other information may also be communicated depending on the protocol and features supported by data storage system 120. The flash translation layer translates LBAs received from a RAID controller 124 into physical addresses assigned to corresponding physical location in NAND flash memory systems 150. Flash controllers 140 may perform address translation and/or store mappings between logical and physical addresses in a logical-to-physical translation data structure, such as a logical-to-physical translation table (LPT), which may conveniently be stored in flash controller memory 142.

NAND flash memory systems 150 may take many forms in various embodiments. In the embodiment shown in FIG. 1B, each NAND flash memory system 150 includes multiple (e.g., 32) individually addressable NAND flash memory storage devices 152. In the illustrated example, the flash memory storage devices 152 take the form of a board-mounted flash memory modules, for example, Multi-Level Cell (MLC), Three Level Cell (TLC), or Quad Level Cell (QLC) NAND flash memory modules. The effective storage capacity provided by flash memory storage devices 152 can be increased through the implementation of data compression, for example, by flash controllers 140 and/or high level controllers, such as GPPs 132, RAID controllers 124 or SMCs 123.

Figure 2:
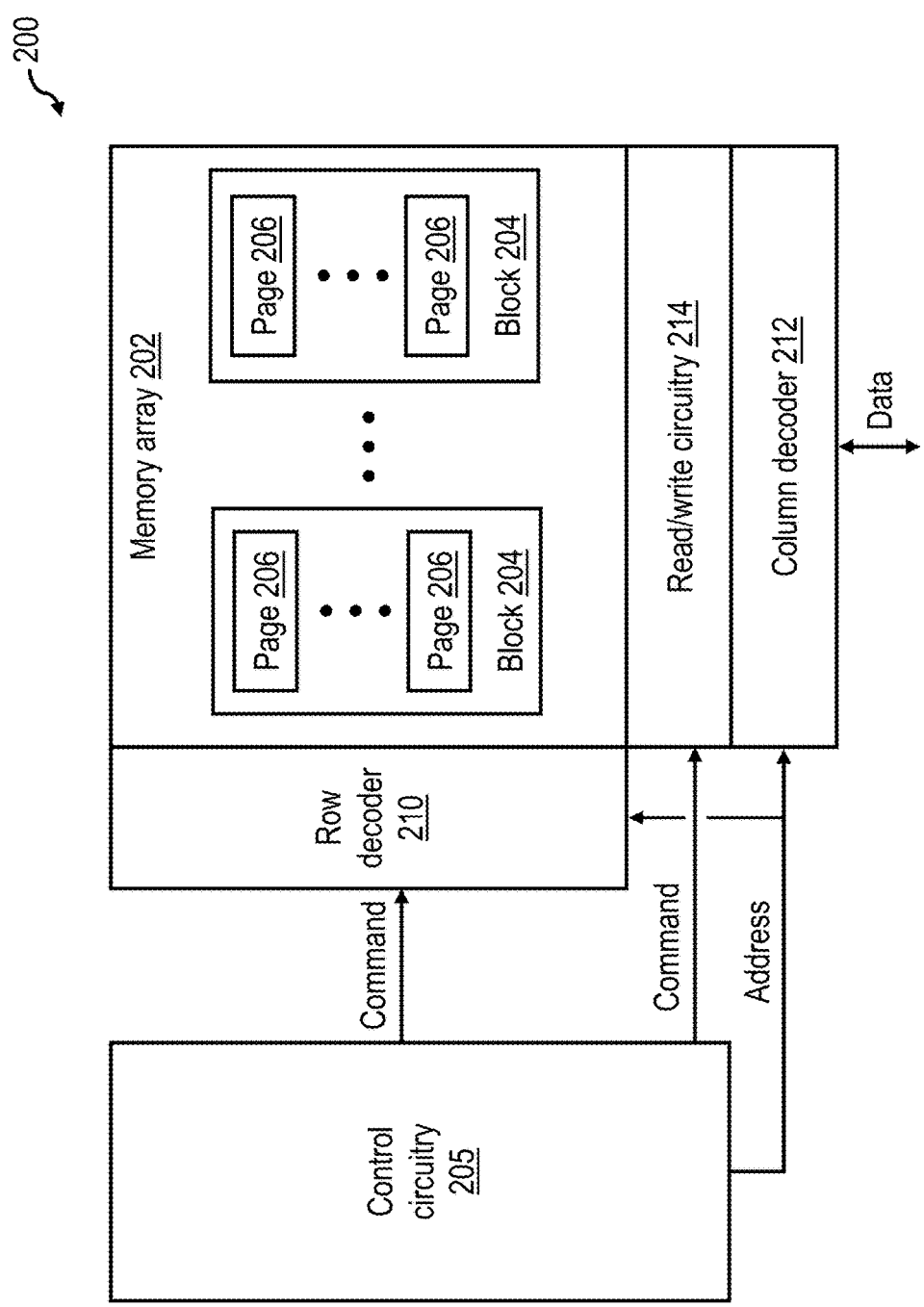
FIG. 2 depicts an exemplary NAND flash memory module in accordance with one embodiment.

Referring now to FIG. 2, there is depicted a block diagram of an exemplary flash memory module 200 that can be utilized to implement any of the NAND flash memory storage devices 152 of FIG. 1B. Flash memory module 200 includes one or more memory die, each implementing at least one memory array 202 formed of a two-dimensional or three-dimensional array of NAND flash memory cells. As indicated in FIG. 2, the memory cells within memory array 202 are physically arranged in multiple blocks 204, each in turn including multiple physical pages 206. As discussed below, these physical pages 206 can be grouped in page groups, which can each be formed, for example, of all the physical pages 206 coupled to a common wordline, of all physical pages 206 in one or more vertically stacked physical layers of a 3D NAND flash, of a set of physical pages 206 in a physical layer (e.g., all pages of a same page type (i.e., upper pages, lower pages, extra pages, or top pages), or generally of physical pages 206 with similar characteristics. In one embodiment, multiple physical pages 206 with common word lines are disposed on the same physical layer, and blocks 204 are built from physical pages 206 having cells in a common physical layer.

As is known to those skilled in the art, NAND flash memory, such as that employed in memory array 202, must be erased prior to being programmed. Further, NAND flash memory can be (but is not required to be) constrained by its construction such that the smallest granule of storage that can be erased is a block 204 and the smallest granule of storage that can be accessed by a read or write request is fixed at the size of a single physical page 206. It should be appreciated in this regard that the LBAs provided by host devices correspond to logical pages within a logical address space, where each logical page typically has a size of 4 kilobytes (kB). Physical pages 206, in contrast, typically have a larger size, for example, 16 kB, and can thus host multiple logical pages.

Flash memory module 200 further includes a row decoder 210 through which word lines of memory array 202 can be addressed and a column decoder 212 through which bit lines of memory array 202 can be addressed. In addition, flash memory module 200 includes read/write circuitry 214 that enables the memory cells of a physical page 206 to be programmed or read in parallel. Flash controller 200 additionally includes control circuitry 205 that provides chip-level control of operation of memory array 202, including read and write accesses made to physical pages 206 in memory array 202, erasure of blocks 204, and the amplitude, duration and polarity of related voltages applied to memory array 202.

Having described the general physical structure of one exemplary embodiment of a data storage system 120, certain operational aspects of data storage system 120 are now described with reference to FIG. 3, which is a high level flow diagram of the flash management functions and data structures employed by a GPP 132 and/or flash controller 140 in accordance with one embodiment.

Data storage system 120 does not generally allow external devices (e.g., hosts) to directly address and/or access the physical memory locations within NAND flash memory systems 150. Instead, data storage system 120 is generally configured to present to host devices one or more logical volumes each having a contiguous logical address space, thus allowing host devices to read and write data to and from logical block addresses (LBAs) within the logical address space while permitting one or more of the various levels of controllers (e.g., system management controller 123, RAID controllers 124, flash controllers 140 and GPP 132) to control where the data that is associated with the various LBAs actually resides in the physical memory locations comprising NAND flash memory systems 150. In this manner, performance and longevity of NAND flash memory systems 150 can be intelligently managed and optimized. In the illustrated embodiment, each flash controller 140 performs logical-to-physical address translation for an associated set of LBAs using a logical-to-physical address translation data structure, such as logical-to-physical translation (LPT) table 300, which can be stored, for example, in the associated flash controller memory 142. It should be noted that the logical address supplied to flash controller(s) 140 may be different from the logical address originally supplied to data storage system 120, since various components within data storage system 120 may perform address translation operations between the external devices and the flash controller(s) 140.

Flash management code running on the GPP 132 tracks erased blocks of NAND flash memory system 150 that are ready to be used in ready-to-use (RTU) queues 306, which may be stored, for example, in GPP memory 134. In the depicted embodiment, flash management code running on the GPP 132 maintains one RTU queue 306 per channel or plane (i.e., per data bus), and an identifier of each erased block that is to be reused is enqueued in the RTU queue 306 corresponding to its channel or plane. A build block stripes function 320 performed by flash management code running on the GPP 132 constructs new block stripes for storing data and associated parity information from the erased blocks enqueued in RTU queues 306. The new block stripes are then queued to the flash controller 140 for data placement. Block stripes are preferably formed of blocks residing in different channels, meaning that build block stripes function 320 can conveniently construct a block stripe by drawing each block of the new block stripe from a different RTU queue 306. In general, build block stripes function 320 attempts to construct stripes from blocks of approximately equal health (i.e., expected remaining useful life).

In response to write request received from a host, such as a processor system 102, a data placement function 310 of flash controller 140 determines by reference to LPT table 300 whether the target LBA(s) indicated in the write request is/are currently mapped to physical memory page(s) in NAND flash memory system 150 and, if so, changes the status of each data page currently associated with a target LBA to indicate that the associated data is no longer valid. In addition, data placement function 310 allocates a page stripe if necessary to store the write data of the write request and any non-updated data (i.e., for write requests smaller than a logical page, the remaining valid data from a previous write to the same logical address which is not being overwritten and which must be handled in a read-modify-write manner) from an existing page stripe, if any, targeted by the write request, and/or stores the write data of the write request and any non-updated (i.e., still valid) data from an existing page stripe, if any, targeted by the write request to an already allocated page stripe which has free space left. The page stripe may be allocated from either a block stripe already allocated to hold data or from a new block stripe built by build block stripes function 320. In a preferred embodiment, the page stripe allocation can be based on the health of the blocks available for allocation and the "heat"

(i.e., estimated or measured write access frequency) of the LBA of the write data. Data placement function 310 then writes the write data, associated metadata (e.g., cyclic redundancy code (CRC) and error correcting code (ECC) values), and parity information for the page stripe in the allocated page stripe. Flash controller 140 also updates LPT table 300 to associate the physical page(s) utilized to store the write data with the LBA(s) indicated by the host device. Thereafter, flash controller 140 can access the data to service host read requests by reference to LPT table 300 as further illustrated in FIG. 3.

Once all pages in a block stripe have been written, flash controller 140 places the block stripe into one of occupied block queues 302, which flash management code running on the GPP 132 utilizes to facilitate garbage collection. As noted above, through the write process, pages are invalidated, and therefore portions of the NAND flash memory system 150 become unused. The associated flash controller 140 (and/or GPP 132) eventually needs to reclaim this space through garbage collection performed by a garbage collector 312. Garbage collector 312 selects particular block stripes for garbage collection based on a number of factors including, for example, the health of the blocks 204 within the block stripes and how much of the data within the erase blocks 204 is invalid. In the illustrated example, garbage collection is performed on entire block stripes, and flash management code running on GPP 132 logs the block stripes ready to be recycled in a relocation queue 304, which can conveniently be implemented in the associated flash controller memory 142 or GPP memory 134.

The flash management functions performed by GPP 132 or flash controller 140 additionally include a relocation function 314 that relocates the data held in block stripes enqueued in relocation queue 304. To relocate such data, relocation function 314 issues relocation write requests to data placement function 310 to request that the valid data of the old block stripe be written to a new block stripe in NAND flash memory system 150. In addition, relocation function 314 updates LPT table 300 to remove the current association between the logical and physical addresses of the data. Once all remaining valid data has been moved from the old block stripe, the old block stripe is passed to dissolve block stripes function 316, which decomposes the old block stripe into its constituent blocks 204, thus disassociating the blocks 204. Each of the blocks 204 formerly forming the dissolved block stripe is then erased under the direction of flash controller 140 and/or the control circuitry 205 of the relevant flash memory module 200, and a corresponding program/erase (P/E) cycle count 334 for each erased block is incremented. Based on the health metrics of each erased block 204 (e.g., bit error rate (BER) metrics, uncorrectable errors, P/E cycle count, etc.), each erased block 204 is either retired (i.e., withdrawn from use) by a block retirement function 318 among the flash management functions executed on GPP 132, or alternatively, prepared for reuse by placing the identifier of the block 204 on the appropriate ready-to-use (RTU) queue 306 in the associated GPP memory 134.

Figure 3:
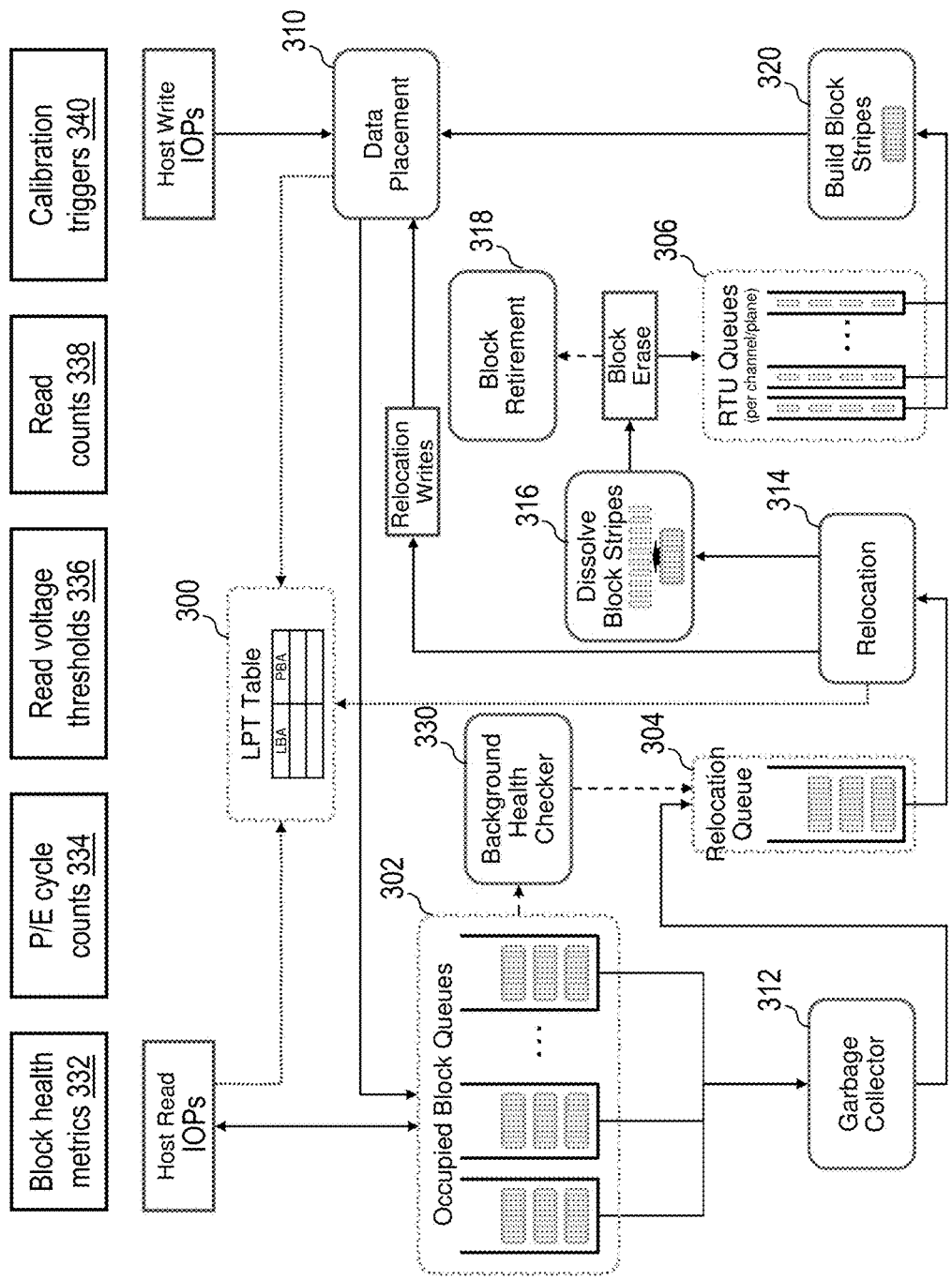
FIG. 3 is a high level flow diagram of the flash management functions and data structures employed in flash management in accordance with one embodiment.

As further shown in FIG. 3, the flash management functions executed on GPP 132 and/or flash controller 140 additionally include a background health checker 330. Background health checker 330, which operates independently of the read and write requests of hosts, such as processor systems 102, continuously determines one or more block health metrics 332 for blocks belonging to block stripes recorded in occupied block queues 302. Based on the one or more of the block health metrics 332, background health checker 330 places block stripes on relocation queue 304 for handling by relocation function 314. Key block health metrics 332 preferably monitored and recorded by background health checker relate to the bit error rate (BER) metrics observed for valid blocks and physical pages, and may include, for example, the worst page BER of each block, the mean page BER of each block, the rates of change of the worst page BER and mean page BER of each block, etc. In order to obtain the most accurate health estimate possible, health can be determined from an analysis of valid and invalid data, thereby ensuring that blocks containing almost entirely invalid data are fully analyzed to determine overall block health.

As described in greater detail below, one function of GPP 132 and/or flash controller 140 that can be incorporated within background health checker 330 or that can be separately implemented is the periodic adaptation (calibration) of read voltage thresholds 336 utilized to decode the data bits stored within the memory cells of memory arrays 202. These read voltage thresholds 336, which can be individually defined to any desired level of granularity (e.g., per-page, per page group within a block, per block, etc.), are preferably selected to improve one or more bit error metrics. As further depicted in FIG. 3, GPP 132 and/or flash controller 140 preferably track additional statistics to facilitate intelligent adaptation of read voltage thresholds 336. These additional statistics can include, for example, P/E cycle counts 334 identifying a number of program/erase cycles to which each block has been subjected and read counts 338 indicating a number of times a given memory unit (e.g., page, page group and/or block) has been read since being programmed. In addition, these statistics can include calibration triggers 340, such as per-memory unit counters indicating an elapsed amount of time since read voltage thresholds of that memory unit were adapted and/or per-block counters indicating a number of program/erase cycles that each block has been subjected to since the read voltage thresholds for that block were last adapted.

Referring now to FIGS. 4A-4B, there is depicted initial and subsequent programmed threshold voltage distributions ($V_{TH}$) for an exemplary multi-level cell (MLC) NAND flash memory. As shown in FIG. 4A, when a block 204 of a NAND flash memory storage device 152 is first put into service, each of the four voltage distributions 400a, 400b, 400c and 400d, respectively representing bit values 11, 10, 00 and 01, is tight and well defined. Consequently, the bit values of the various memory cells can be decoded with little or no error by application of initial read voltage thresholds VA 402a, VB 402b and VC 402c.

Through use, the memory cells within a block 204 will be damaged by, among other things, the voltage stress associated with program/erase (P/E) cycling. As a result of this damage, the distribution of memory cell voltages will no longer reflect the tight distributions shown in FIG. 4A, but will instead be characterized by broader and/or shifted voltage distributions 406a, 406b, 406c, 406d shown in FIG. 4B. Because of the degradation of the voltage distributions, bit values can be erroneously decoded if read voltage thresholds VA 402a, VB 402b and VC 402c continue to be applied, and the bit error rate (BER) for reads of the data will consequently increase.

To reduce the BER, GPP 132 and/or flash controller 140 periodically adapt (calibrate) the read voltage thresholds for one or more individual memory units (e.g., a page, page groups, and/or a block) either negatively (not illustrated) or positively (as shown explicitly in FIG. 4B). For example, in FIG. 4B read voltage thresholds VA 402a, VB 402b and VC 402c are each shifted positively by an individually determined offset ΔA, ΔB or ΔC selected to reduce and/or minimize the BER. Thus, in the example of FIG. 4B, read voltage thresholds VA 402a, VB 402b and VC 402c are replaced by read voltage thresholds VA+ΔA 404a, VB+ΔB 404b and VC+ΔC 404c, respectively. The signs and magnitudes of the read voltage threshold offsets selected by GPP 132 and/or flash controller 140 can and will vary over the lifetime of a memory unit based on various environmental factors (e.g., temperature) and use factors (e.g., read disturbs, write disturbs, erase disturbs, data retention effects, etc.).

Figure 5:
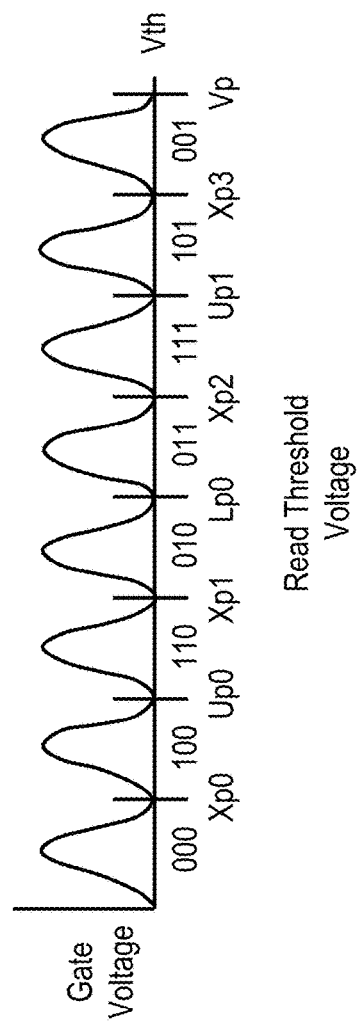
FIG. 5 is a graph illustrating read threshold voltages and bit values for an exemplary three-level cell (TLC) NAND flash memory.

Although FIGS. 4A-4B illustrate the calibration of the three read voltage thresholds utilized to define the four possible bit value combinations represented by the charge stored on the floating gate of an MLC flash memory cell, it will be appreciated that the same principles are applicable to other types of non-volatile memories, including TLC and QLC NAND flash. For example, FIG. 5 is a graph illustrating the seven read threshold voltages defining the eight possible bit value combinations that can be represented by the charge stored on the floating gate of an exemplary TLC NAND flash memory cell. Like the read voltage thresholds employed in MLC NAND flash, the seven read voltage thresholds of the TLC NAND flash are subject to repeated calibration and positive or negative adaptation during use.

In the art, the least significant bit value of a TLC NAND flash cell is said to form a portion of a "lower page," the next least significant bit forms a portion of the "upper page," and the most significant bit forms a portion of the "extra page." For QLC, this tripartite division of page types is augmented by a fourth bit of data within a "top page" or "additional page." FIG. 5 illustrates the various read voltage thresholds utilized to distinguish the different possible bit values of the various pages in one embodiment of TLC NAND flash memory. For example, a single read voltage threshold Lp0 is utilized to distinguish between the two possible least significant bit (i.e., lower page) values, with a voltage less than Lp0 representing a 0 and a voltage greater than Lp0 representing a 1. Two read voltage thresholds, Up0 and Up1, are further utilized to distinguish between the two possible middle bit (i.e., upper page) values, with a voltage between Up0 and Up1 representing a 1 and a voltage less than Up0 or greater than Up1 representing a 0. Finally, four read voltage thresholds Xp0-Xp3 are utilized to distinguish between the two possible most significant bit (i.e., extra page) values, with a 0 being represented by a voltage less than Xp0 or between Xp1 and Xp2 or greater than Xp3 and a 1 being represented by a voltage between Xp0 and Xp1 or between Xp2 and Xp3. Of course, in other embodiments, different assignments between bit values and read voltage thresholds are possible.

As noted above, as non-volatile memory density continues to increase and as new non-volatile storage technologies, such as 3D NAND flash, are developed, the appropriate calibration of read voltage thresholds has become an increasingly significant driver of memory accuracy, performance, and longevity. While bit errors in reading data from non-volatile memory can certainly be minimized by frequent and individual calibration of each read voltage threshold of each physical page, uniformly performing such resource-intensive calibration would be impractical in enterprise-class non-volatile memory systems due to both the associated time overhead and the massive volume of calibration metadata that would have to be maintained. Consequently, the present application appreciates that it would be desirable to reduce the time and metadata overhead associated with calibration of a non-volatile memory by dynamically tailoring the calibration that is performed to the error metrics observed in different subsets of memory. In this way, more resource-intensive calibration can be performed for memory subsets that would clearly benefit from more precise calibration due to a greater number of observed errors, while less resource-intensive calibration (including no calibration) can be performed for other memory subsets.

Figure 6:
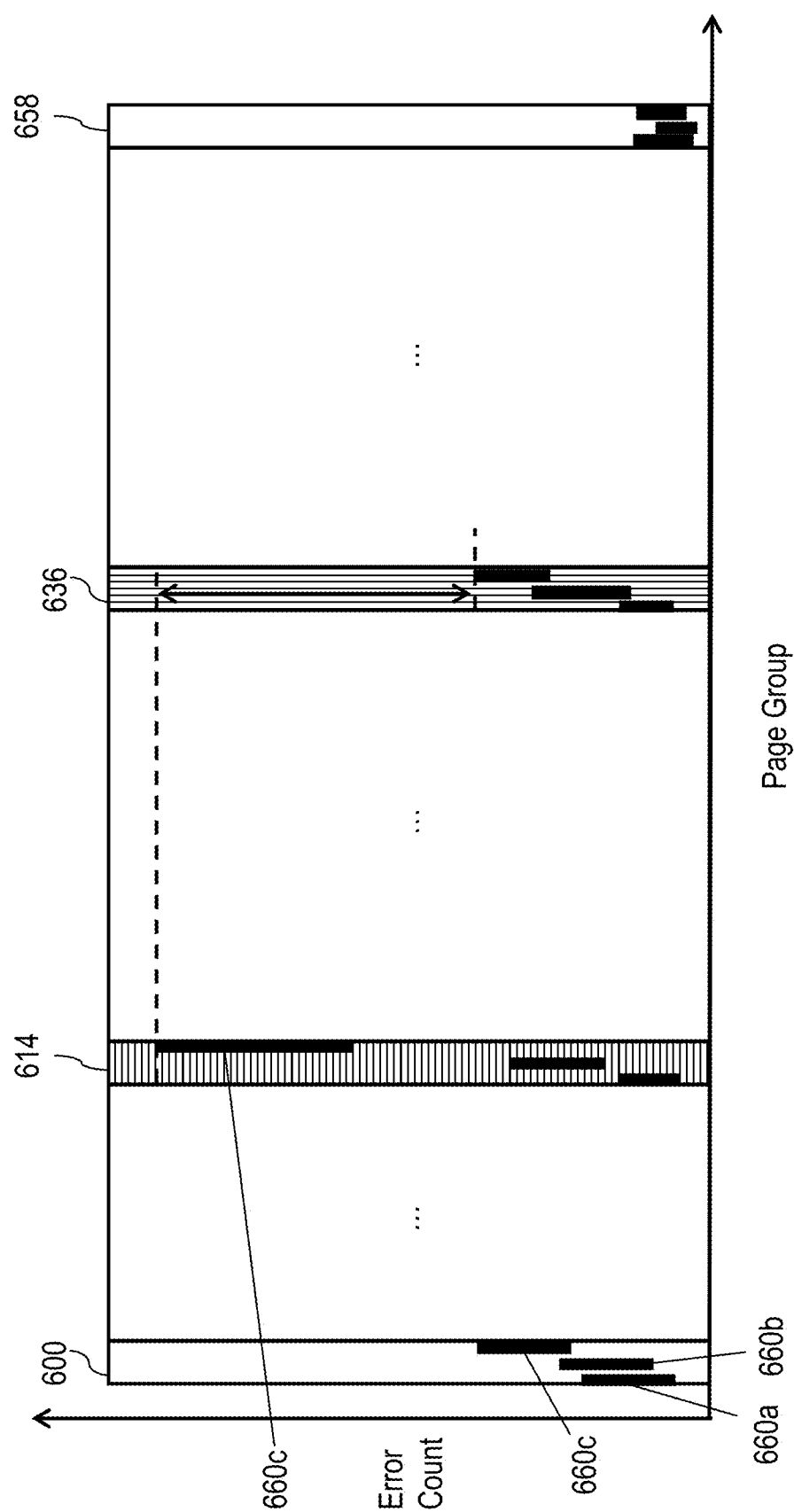
FIG. 6 is a graph depicting an exemplary distribution of error counts of particular page groups in a recently programmed block of a 3D NAND flash memory.

The variation in error counts observed for different subsets of a non-volatile memory is depicted in FIG. 6, which provides a graph of an exemplary distribution of error counts of particular page groups for a recently programmed block of 3D TLC NAND flash memory. In this example, the block includes memory cells residing in numerous different physical layers of the 3D TLC NAND flash memory, and the error counts for particular physical layers are illustrated in a respective one of bounding rectangles 600-658. While each bounding rectangle 600, 614, 636, and 658 shown here corresponds to a single layer, multiple layers with similar characteristics may be used in other embodiments as well. Within each bounding rectangle are three error count bars 660a-660c, each indicating the range of errors counts of physical pages in a respective page group, where the three page groups are respectively formed of lower pages (corresponding to left-most error count bars 660a), upper pages (corresponding to middle error count bars 660b), and extra pages (corresponding to right-most error count bars 660c).

From this exemplary error distribution, it can be observed that the error counts of pages in a recently programmed block vary significantly across the block based on page type, physical layer, and/or page group. Further, different physical layers of the memory can exhibit very different error characteristics in terms of both the maximum number of errors (i.e., worst physical page in a page group) and the range of error counts between the physical pages within a given page group. For example, in the physical layer corresponding to bounding rectangle 614, the error count of the page group formed of extra pages (represented by error count bar 660c) has a worst page error count that is significantly greater than that of the page group formed of extra pages in physical layer 636. Consequently, calibration overhead, in terms of the number of calibration reads to be performed and the number of metadata updates, for one or more of the page groups in the physical layer corresponding to bounding rectangle 636 can potentially be greatly reduced as compared to that of the page groups in the physical layer corresponding to bounding rectangle 614.

Figure 7:
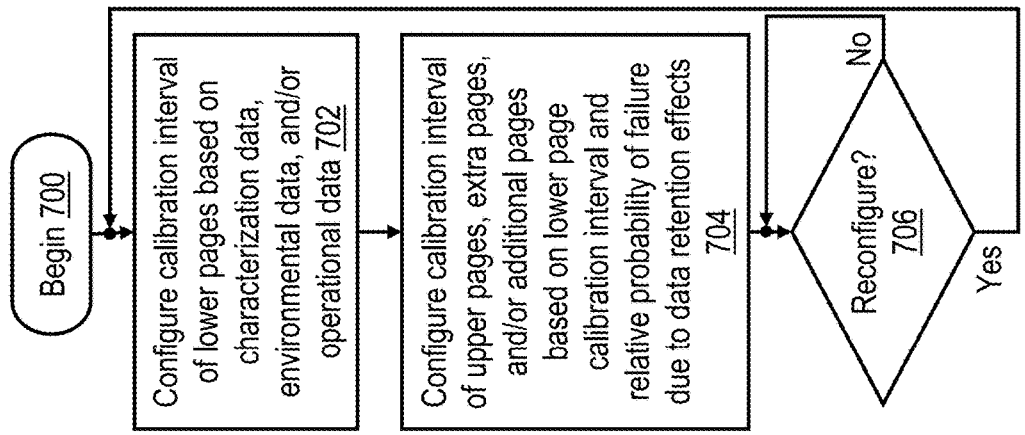
FIG. 7 is a high level logical flowchart of an exemplary process for configuring calibration intervals for different pages based on the pages' relative probabilities of failure due to data retention effects.

With reference now to FIG. 7, there is depicted a high level logical flowchart of an exemplary process for configuring calibration intervals for different types of physical pages, for example, based on the pages' relative probabilities of failure due to data retention effects. The calibration intervals are used ensure that blocks are being calibrated in regular time intervals. In other embodiments the calibration intervals are used to periodically evaluate if a block needs to be calibrated. The process of FIG. 7 can be performed by a controller, such as a GPP 132 and/or flash controller 140. For example, in one embodiment, which will hereafter be assumed, the process is performed by the GPP 132 of each flash card 126 through execution of program instructions stored within its associated GPP memory 134.

The process of FIG. 7 begins at block 700 and then proceeds to block 702, which illustrates GPP 132 configuring a calibration interval for lower pages. In at least some preferred embodiments, the calibration interval $C_1$ for lower pages is initially configured based on device characterization data, which indicate a data retention period after which tunneling effects will cause the charge on the floating gates of the cells to decrease to the point that an unacceptably high bit error rate (e.g., a bit error rate sufficient to cause a page read failure or a percentage thereof) will be observed. In subsequent reconfigurations, if any, the lower page calibration interval can additionally be configured based on environmental data (e.g., temperature, humidity, etc.) and/or operational data, such as block health metrics 332 and/or P/E cycle counts 334. It should be appreciated that the lower page calibration interval $C_1$ for lower pages can be expressed in either chronological time (e.g., second, minutes, hours, and/or days) and/or wear (e.g., P/E cycles) and/or number of reads.

At block 704, GPP 132 additionally configures calibration intervals of upper pages, extra pages, and/or additional pages (depending on the number of page types supported by the implemented memory devices) based on the lower page calibration interval and relative probability of failure due to data retention effects. For example, in one exemplary implementation, GPP 132 configures the calibration interval of the upper pages, extra pages, and/or additional pages at a rate directly proportional to the various page types' relative probabilities of failure. If the probabilities of read failure of additional pages, extra pages, upper pages, and lower pages are represented by $p_a$, $p_x$, $p_u$, and $p_1/p_1$, respectively, then frequency of calibrations of the additional pages $C_a$ can be given by $C_1 \times p_a/p_1$ (e.g., since additional pages generally have higher probability of read failures, they have to be calibrated more frequently). Equivalently, the frequency can be inverted to calculate the time interval between calibrations, in which case the time interval between calibrations of the additional pages could be given by $C_a = C_1 \times p_1/p_a$. Similarly for other page types, the calibration interval $C_x$ of the extra pages could be given by $C_x = C_1 \times p_1/p_x$, and the calibration interval $C_u$ of the upper pages could be given by $C_u = C_1 \times p_1/p_u$. In some embodiments, the probabilities can be further directly related to the number of read voltage thresholds per page type, meaning that in these embodiments the additional page calibration interval $C_a$ would have a duration one-eighth that of lower page calibration interval $C_1$, extra page calibration interval $C_x$ would have a duration one-fourth that of lower page calibration interval $C_1$, and upper page calibration interval $C_u$ would have a duration one-half that of lower page calibration interval $C_1$.

Following blocks 702 and 704, GPP 132 determines at block 706 whether or not the calibration intervals of the various page types should be reconfigured. For example, GPP 132 may determine to reconfigure the calibration intervals based on the elapse of time, an average number of P/E cycles across all of its blocks, and/or the number of reads to the pages, page groups, or block, and/or environmental data, such as temperature. If GPP 132 determines at block 706 not to reconfigure the calibration intervals, the process iterates at block 706. If, however, GPP 132 determines to reconfigure the calibration intervals at block 706, the process of FIG. 7 returns to blocks 702-704, which have been described.

Figure 8:
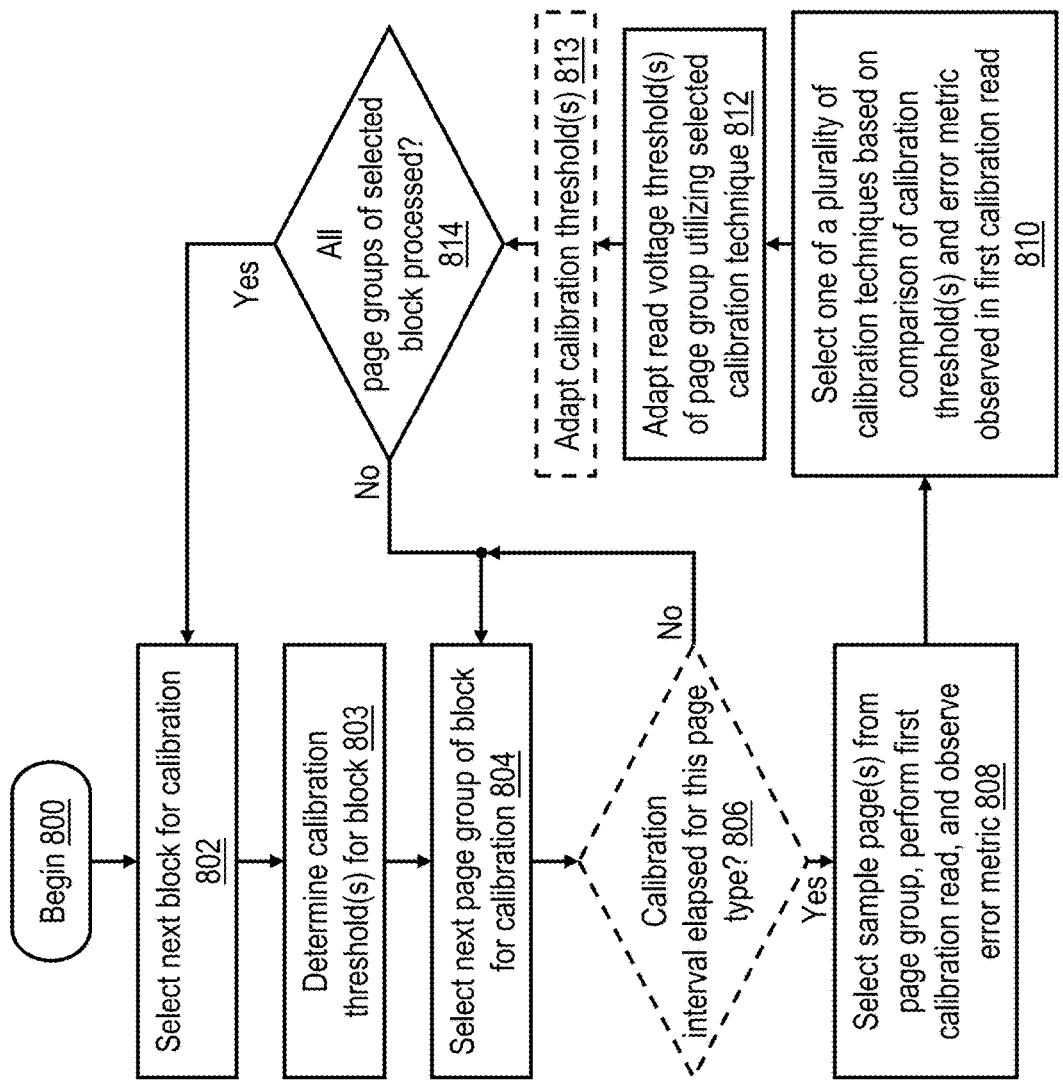
FIG. 8 is a high level logical flowchart of an exemplary process for adaptively calibrating read voltage thresholds of a non-volatile memory in accordance with one embodiment.

Referring now to FIG. 8, there is depicted a high level logical flowchart of an exemplary process for adapting (calibrating) read voltage thresholds of a non-volatile memory in accordance with one embodiment. The exemplary process, which is preferably performed by a controller, such as a GPP 132 and/or flash controller 140, can be incorporated within background health checker 330 or can be separately implemented. In various embodiments, the read voltage thresholds can be individually defined for a memory unit at any desired level of granularity (e.g., per-page, per page group within a block, per block, etc.). For ease of understanding, the following description assumes that each page group within a block is formed of pages that are of the same page type (e.g., lower pages, upper pages, extra pages, or additional pages).

The process of FIG. 8 begins at block 800 and then proceeds to block 802, which illustrates the controller selecting a next block 204 of memory for read voltage threshold calibration. The selection may be based on the outcome of the process illustrated in FIG. 7 as described above. At block 803, the controller determines one or more calibration thresholds for the block. For example, these calibration threshold(s) can include a lower calibration threshold that specifies a value for an error metric below which calibration need not be performed and/or at least one upper calibration threshold that specifies a value for an error metric above which calibration is recommended. The calibration threshold(s) for a block can be specified, for example, as values of an error count, bit error rate, number of iterations performed during error correction, or other error metric that applies to a page, ECC codeword, or another granularity of data. In some embodiments, a lower calibration threshold, if employed, can be fixed or variable. As one specific example, the lower calibration threshold can be dynamically set equal to the maximum BER (i.e., worst page BER) for a newly calibrated page group in the block. In some embodiments, the upper calibration threshold can be set, for example, to be equal to an error count margin (ECM) specifying a value of the error metric that, if exceeded by a newly calibrated block, can cause the controller to retire a block. In some embodiments, this ECM can be fixed as a percentage of the error metric corresponding to the maximum number of errors correctable by the controller via ECC. In other embodiments, the upper calibration threshold can be set lower than the ECM, for example, based on offline or online characterization data or based on the error metrics achieved through calibration of previous page groups within the block. As one specific example, the upper calibration threshold can be dynamically set to be equal to the maximum post-calibration BER of other page groups in the block that have already been calibrated.

In various embodiments or in various operating modes, the controller may determine the calibration threshold(s) based on characterization data for the memory and/or a current state of the block. The characterization data, if employed, may indicate different calibration thresholds for different blocks based on the inherently differing wear profiles of the blocks over the life of the memory. If the calibration threshold(s) are based on the current state of the block, the controller may take into consideration one or more indicia of the current state, such as the P/E cycle count of the block, one or more of block health metrics 332, the health grade of the block, statistical measurements of the block erase time, page program or page read time of the block, etc.

At block 804, the controller selects a first or next page group to process in the selected block. The controller then optionally determines at block 806 whether or not the calibration interval for the page type of the physical pages forming the currently selected page group (as determined in the method of FIG. 7) has elapsed. The controller may make the determination depicted at block 806, for example, by reference to per-page group counters within calibration triggers 340 indicating an elapsed amount of time since read voltage thresholds of that page group were most recently adapted and/or per-page group counters within calibration triggers 340 indicating a number of P/E cycles that the block has been subjected to since the read voltage thresholds for that page group were last adapted.

In response to a negative determination at block 806, read threshold calibration is not performed for the selected page group, and the process returns to block 804. If, however, the controller determines at block 806 that the calibration interval for the page type of the pages forming the currently selected page group has elapsed, the process proceeds to block 808. Block 808 illustrates the controller selecting one or more sample physical pages from the current page group. In some embodiments, the controller determines how many and/or which sample page(s) to select at block 808 utilizing a random or pseudo-random selection. In other embodiments, the controller may make an informed selection of how many and/or which sample page(s) to represent the page group, for example, based on characterization data and/or operational data or round robin selection. For example, in one embodiment, the controller may determine how many and which pages will be read from the selected page group based on bit error rates (BERs) recorded as part of block health metrics 332. In any case, it is preferred if the set of sample physical pages is a small subset of the total number of physical pages in the page group. As further illustrated at block 808, the controller then performs a first calibration read of each of the selected sample physical page(s) and observes an error metric (e.g., error count or BER) for the sample physical page(s). If multiple sample physical pages are selected, the error metric for the sample pages can be, for example, the average of the error metrics for the individual pages or the worst page error metric (e.g., highest error count or BER).

At block 810, the controller compares the error metric observed at block 808 with the calibration threshold(s) for the block determined at block 803. Based on that comparison, the controller dynamically selects a calibration technique among a plurality of different calibration techniques. The controller then adapts the read voltage threshold(s) of the page group utilizing the selected calibration technique, as shown at block 812. One embodiment of this adaptation process is described further below with reference to FIG. 9. Following block 812, the controller optionally adapts the calibration threshold(s) at block 813. The adaptation of the calibration threshold(s) may be based on the post-calibration BER of the selected page group or the post-calibration BER obtained in this calibration iteration of one or more page groups in the block. Next, the controller determines at block 814 whether or not all page groups of the selected block have been processed. If not, the process of FIG. 8 returns to block 804 and selects the next page group for calibration as described above. If, however, controller determines at block 814 that all page groups in the currently selected block have been processed, the process returns to block 802, which illustrates the controller selecting a next block of non-volatile memory for read voltage threshold calibration.

Figure 9:
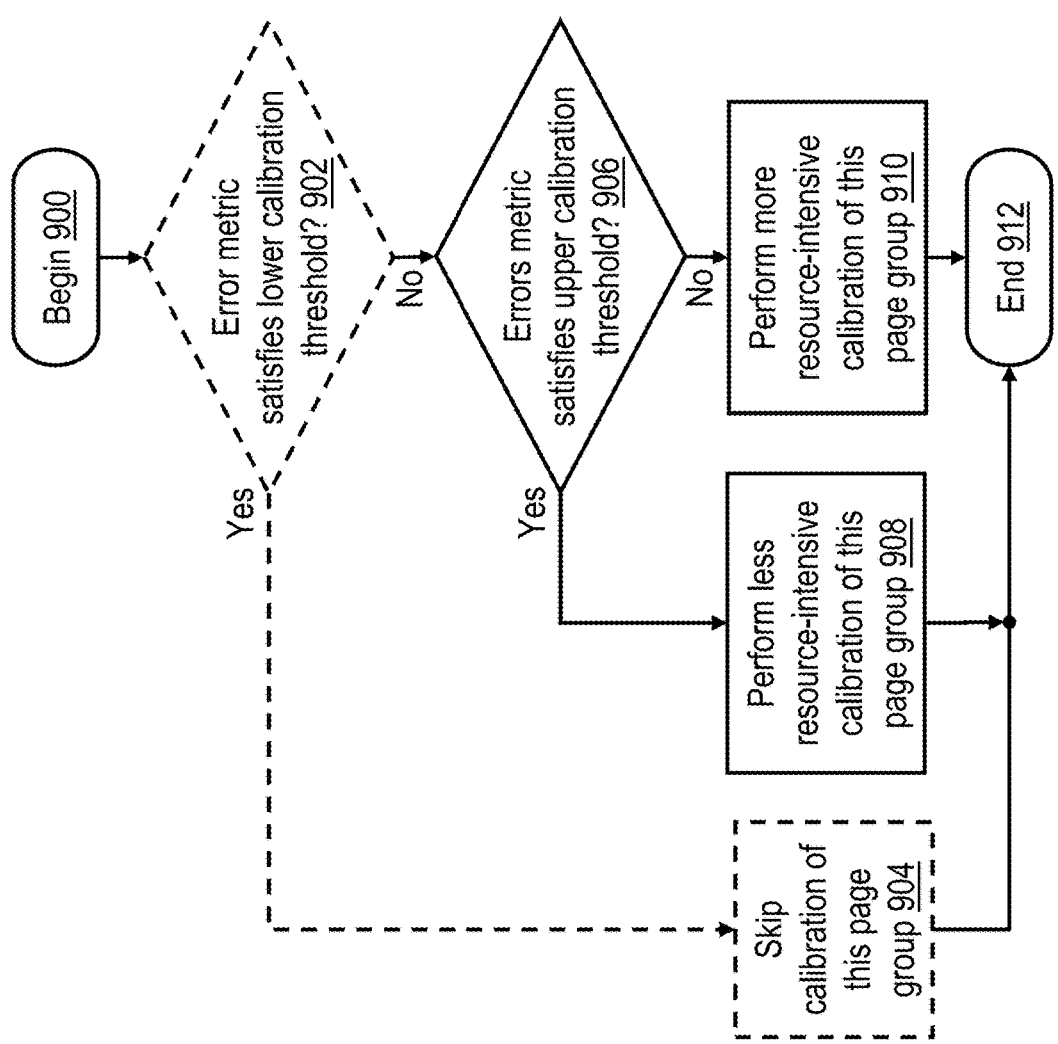
FIG. 9 is a more detailed logical flowchart of an exemplary process for selectively calibrating read voltage thresholds of non-volatile memory utilizing a plurality of different calibration techniques based observed error metrics.

With reference now to FIG. 9, there is illustrated a high level logical flowchart of an exemplary process for selectively calibrating read voltage thresholds utilizing a plurality of different calibration techniques based on observed error metrics. The process illustrated in FIG. 8 can be utilized by a controller to implement, for example, the process shown at blocks 810 and 812 of FIG. 8.

The process of FIG. 9 begins at block 900 and then proceeds, if implemented, to optional block 902, which illustrates the controller determining whether or not the error metric of the sample physical page(s) of the page group satisfies (e.g., is less than) the lower calibration threshold. As noted above, the lower calibration threshold can be a fixed or variable value of the error metric, such as the maximum BER (i.e., worst page BER) of a newly calibrated page group in the same block. In response to a determination at block 902 that the error metric observed for the sample physical page(s) of the current page group satisfies the lower calibration threshold, the controller preferably skips calibration of the page group (block 904), thus leaving the read voltage thresholds of the page group unchanged for the current calibration iteration.

In response to a negative determination at optional block 902 or if block 902 is omitted, the controller determines at block 906 whether or not the error metric observed for the sample physical page(s) of the current page group satisfies the upper calibration threshold. If so, controller calibrates the current page group utilizing a less resource-intensive calibration technique (block 908). If not, controller calibrates the current page group utilizing a more resource-intensive calibration technique (block 910). Following any of blocks 904, 908, or 910, the process of FIG. 9 ends at block 912.

In one exemplary embodiment, the less resource-intensive calibration technique depicted at block 908 can be a so-called "snap" calibration in which offsets for one or more read voltage thresholds are determined for only the sample physical page(s) and then employed for all physical pages in the page group. As will be appreciated, a snap calibration dramatically reduces the number of configuration reads that the controller must perform as compared to a "full" calibration in which offsets for all the read voltage thresholds of all physical pages in the page group are individually determined. In another embodiment, the less resource-intensive calibration technique depicted at block 908 may individually read each physical page in the page group (rather than just the sample physical pages) for the calibration, but may still reduce calibration reads as compared to a full calibration by determining one or more common offsets each for two or more read voltage thresholds in each physical page and then determining the best common offset(s) which will be applied to all other read voltage thresholds of the same page group.

In one exemplary embodiment, the more resource-intensive calibration technique depicted at block 910 can be a full calibration as discussed above. In an alternative embodiment, the more resource-intensive calibration technique depicted at block 910 may instead individually read each physical page in the page group (rather than just sample physical pages) for the calibration, but may still require fewer calibration reads than a full calibration by determining one or more offsets for two or more read voltage thresholds in each physical page and then determining the best common offset(s) which will be applied to all other read voltage thresholds of the same page group.

Figure 10:
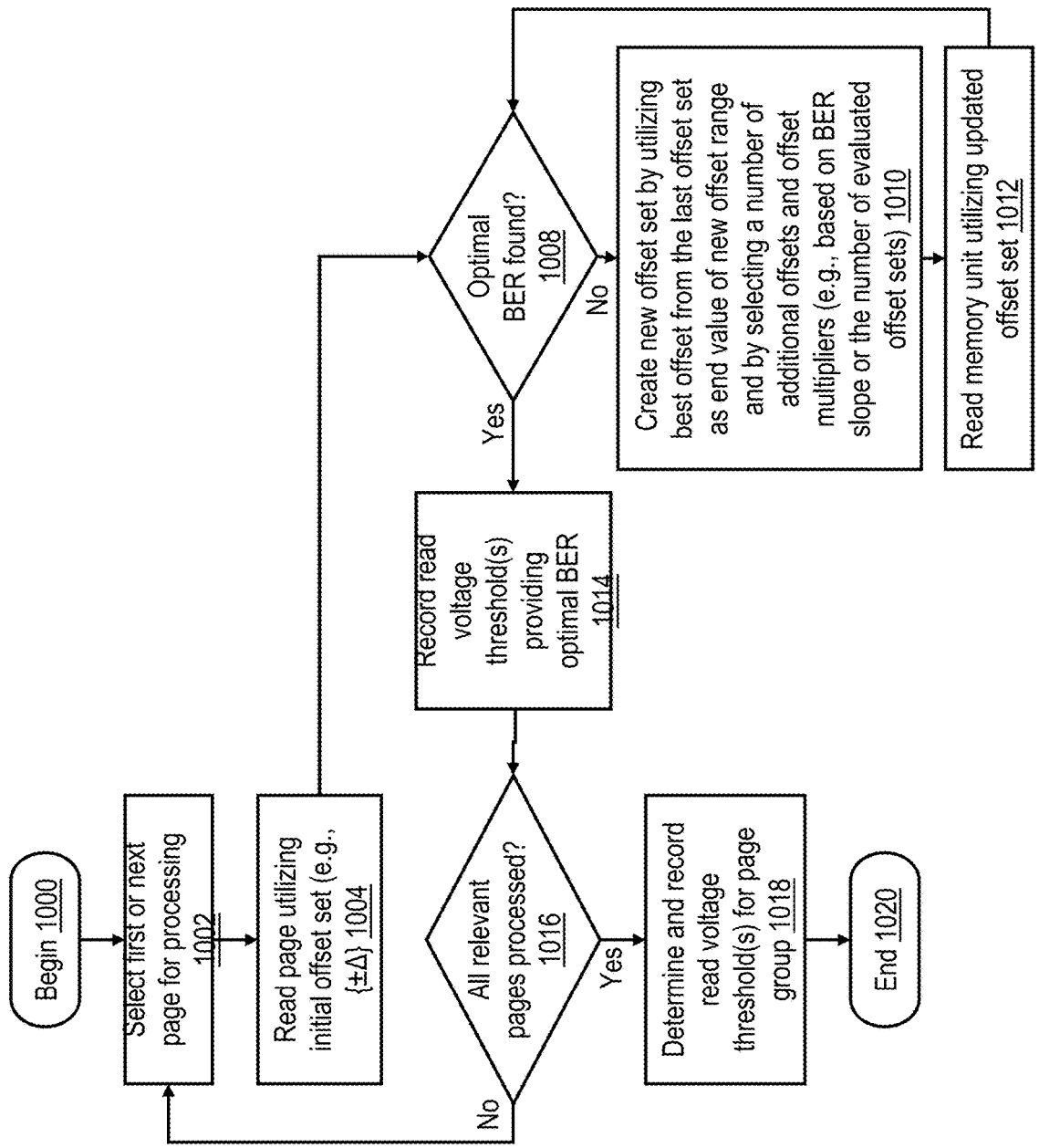
FIG. 10 is a more detailed logical flowchart of an exemplary process for dynamically determining read voltage threshold values for a page group of non-volatile memory based on bit error rate feedback.

Referring now to FIG. 10, there is depicted a logical flowchart of an exemplary process for dynamically adapting read voltage threshold values for a page group of non-volatile memory based on observed bit error metrics. The controller can employ the illustrated process in determining offsets for read voltage thresholds at either of blocks 908 and 910 of FIG. 9.

The process of FIG. 10 begins at block 1000 illustrates the controller selecting a first or next page of the page group for processing. In the calibration performed at block 908, the page selected at block 1002 can be selected from among only the sample pages identified at block 808. Alternatively, in the calibration performed at block 910, the controller may select from among all pages in the page group at block 1002. Next, at block 1004, the controller reads the selected page of the selected page group utilizing the current read voltage threshold(s) for that page shifted positively and negatively by an initial offset set {+Δ}, where Δ represents an increment of voltage change. The controller then determines at block 1008 whether or not the read voltage threshold offset resulting in the optimal BER for the page was found utilizing the initial offset set. For example, the controller can determine that the optimal BER has been found if reading the page utilizing the offsets −Δ and +Δ results in greater or equal BERs than utilizing an initial offset of 0. In another embodiment, the controller can determine that the optimal BER has been found if reading the page utilizing the offsets −Δ and +Δ would not reduce the BER more than some configured tolerance BER, which can be given, for example, as an absolute number (certain number of bit errors are tolerated for the given page), or as a percentage of the BER. There can also be additional limitations when the tolerance BER can be applied, for example only in early life, or under low BER values. In response to a determination at block 1008 that the offset providing the optimal BER has been successfully identified, the process proceeds from block 1008 to block 1014, which is described below. However, in response to a determination at block 1008 that reading data from the memory unit utilizing the current offset set did not definitively identify the offset providing the optimal BER for the page, the process proceeds from block 1008 to block 1010.

Block 1010 illustrates the controller creating a new offset set to test by utilizing the offset in the previous offset set that provided the lowest BER as the end value of new offset range and by selecting a number of additional offsets and/or offset multipliers. In some embodiments, the range and/or number of offsets selected for inclusion in the new offset set at block 1010 can be determined based on the BER slope observed for the different values in the previous offset set. For example, in some embodiments, at block 1010 the controller employs three offsets in the offset set, but varies a multiplier by which the base offset (Δ) is multiplied based on the BER slope. In other embodiments, both the number of offsets in the new set of offsets and the offset multiplier are varied. In general, the controller may utilize more offsets and/or use larger offset multiplier(s) if the BER slope is relatively large and utilize fewer offsets and/or smaller offset multiplier(s) if the BER slope is relatively small. As one example, assuming that testing utilizing the initial offset set revealed that the offset of −Δ provided the lowest BER, at block 1010 the controller may create a new offset set {−Δ, −2Δ, −3Δ}. In some embodiments, the offset multiplier is varied based on the number of offset sets evaluated until that point at block 1010. For example, offset multiplier(s) may be larger for the first offset set generated at block 1010, and the offset multiplier(s) may get reduced for each offset set generated at block 1010. Such embodiments have the advantage of the improved confidence that the calibration process would terminate successfully in a certain number of steps, even for blocks or technologies that have unstable/unpredictable BER slopes.

At block 1012, the controller reads data from the memory unit utilizing the read voltage threshold offsets in the updated offset set and notes the BER obtained through the use of each offset. The controller then determines at block 1008 whether or not the offset resulting in the optimal BER for the memory unit was found utilizing the updated offset set. If not, the process returns to block 1010 and following blocks, which have been described. In so doing, the controller incrementally approaches the optimal or near optimal offset that results in the optimal BER for the page. If the controller instead determines at block 1008 that it has found the offset that results in the optimal BER for the page, the controller records the read voltage threshold(s) and/or offsets providing the optimal BER for the page (block 1014).

The process passes from block 1014 to block 1016, which illustrates the controller determining if all relevant pages of the page group have been processed. If not, the process returns to block 1002, which has been described. If, however, all relevant pages of the page group have been processed, the controller determines and records in read voltage thresholds 336 the new read voltage thresholds and/or offsets to be employed to read from page in the page group during the next calibration interval (block 1018). In cases in which a calibration read was performed to only a single sample page, the read voltage threshold(s) recorded at block 1014 may be stored in read voltage thresholds 336 at block 1018. In cases in which multiple pages were subject to calibration read(s), the controller may either record separate per-page read voltage thresholds or determine a per-page group read voltage threshold offsets by taking an average or weighted average of the read voltage threshold(s) recorded at block 1014 for the individual pages. Following block 1018, the process of FIG. 10 ends at block 1020.

In some embodiments, it may be useful and desirable to track the read voltage threshold 336 for each page group using a combination of multiple parameters. For example, in one embodiment, read voltage thresholds 336 may be specified by applying an offset to the default read voltage threshold, where the offset comprises a "base" component ($V_{base}$) that tracks a permanent deviation from the default read voltage threshold (e.g., due to P/E cycling) and a "temporary" component ($V_{temp}$) that tracks temporary changes of read voltage thresholds (e.g., due to data retention or read disturb effects).

FIG. 10 illustrates an embodiment in which the range and/or number of candidate offset values represented in an offset set can are determined by the controller dynamically based on bit error rate (BER) feedback. In some embodiments, the range and number of candidate offset values employed for page reads made during the course of calibration can be static and can be determined, for example, based on characterization data for the memory.

As has been described, in at least one embodiment, a non-volatile memory includes a plurality of physical pages each assigned to one of a plurality of page groups. A controller of the non-volatile memory performs a first calibration read of a sample physical page of a page group of the non-volatile memory. The controller determines if an error metric observed for the first calibration read of the sample physical page satisfies a calibration threshold. The controller calibrates read voltage thresholds of the page group utilizing a first calibration technique based on a determination that the error metric satisfies the calibration threshold and calibrates read voltage thresholds of the page group utilizing a different second calibration technique based on a determination that the error metric does not satisfy the calibration threshold.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude signal media per se, transitory propagating signals per se, and energy per se.

In addition, although embodiments have been described that include use of a NAND flash memory, it should be appreciated that embodiments of the present invention can also be used with any other type of non-volatile random access memory (NVRAM).

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method of adapting read voltage thresholds in a non-volatile memory including a plurality of physical blocks of memory each including a plurality of physical pages, wherein each of the plurality of physical pages is assigned to one of a plurality of page groups, the method comprising:
a controller of the non-volatile memory individually adapting read voltage thresholds of each of the plurality of page groups within each of the plurality of physical blocks such that different ones of the plurality of page groups have differing read voltage thresholds and applying the respective read voltage thresholds to reads performed to physical pages belonging to each of the plurality of page groups, wherein individually adapting read voltage thresholds includes, for each given page group among the plurality of page groups:
performing a calibration read of a sample physical page of the given page group;
the controller determining if an error metric observed for the calibration read of the sample physical page satisfies a calibration threshold; and
the controller calibrating read voltage thresholds applicable to only physical pages in the given page group utilizing a first calibration technique based on a determination that the error metric satisfies the calibration threshold and calibrating the read voltage thresholds of the given page group utilizing a different second calibration technique based on a determination that the error metric does not satisfy the calibration threshold; and
the controller applying a respective different calibration interval for each of the plurality of page groups within the given physical block.

2. The method of claim 1, wherein:
the first calibration technique is a less resource-intensive calibration technique;
the second calibration technique is a more resource-intensive calibration technique; and
calibrating the read voltage thresholds of the given page group utilizing the first calibration technique comprises calibrating read voltage thresholds of the sample physical page and applying the calibrated read voltage thresholds of the sample physical page to all physical pages in the given page group.

3. The method of claim 1, wherein:
the first calibration technique is a less resource-intensive calibration technique;
the second calibration technique is a more resource-intensive calibration technique; and
calibrating read voltage thresholds of the given page group utilizing the second calibration technique comprises individually calibrating each read voltage threshold of one or more physical pages in the given page group.

4. The method of claim 1, wherein:
the calibration threshold is an upper calibration threshold; and
the method further comprises:
the controller determining whether the error metric satisfies a lower calibration threshold; and
the controller skipping calibration of all physical pages in the given page group based on a determination that the error metric satisfies the lower calibration threshold.

5. The method of claim 4, and further comprising:
the controller dynamically determining the lower calibration threshold based on post-calibration error metrics of calibrated page groups.

6. A data storage system, comprising:
a controller for a non-volatile memory including a plurality of physical blocks of memory each including a plurality of physical pages, wherein each of the plurality of physical pages is assigned to one of a plurality of page groups, wherein the controller is configured to individually adapt read voltage thresholds of each of the plurality of page groups within each of the plurality of physical blocks such that different ones of the plurality of page groups have differing read voltage thresholds and to apply the respective read voltage thresholds to reads performed to physical pages belonging to each of the plurality of page groups, wherein individually adapting read voltage thresholds includes, for each given page group among the plurality of page groups:
performing a calibration read of a sample physical page of the given page group;
the controller determining if an error metric observed for the calibration read of the sample physical page satisfies a calibration threshold; and
the controller calibrating read voltage thresholds applicable to only physical pages in the given page group utilizing a first calibration technique based on a determination that the error metric satisfies the calibration threshold and calibrating the read voltage thresholds of the given page group utilizing a different second calibration technique based on a determination that the error metric does not satisfy the calibration threshold; and
wherein the controller is configured to apply a respective different calibration interval for each of the plurality of page groups within the given physical block.

7. The data storage system of claim 6, wherein:
the first calibration technique is a less resource-intensive calibration technique;
the second calibration technique is a more resource-intensive calibration technique; and
calibrating the read voltage thresholds of the given page group utilizing the first calibration technique comprises calibrating read voltage thresholds of the sample physical page and applying the calibrated read voltage thresholds of the sample physical page to all physical pages in the given page group.

8. The data storage system of claim 6, wherein:
the first calibration technique is a less resource-intensive calibration technique;
the second calibration technique is a more resource-intensive calibration technique; and
calibrating read voltage thresholds of the given page group utilizing the second calibration technique comprises individually calibrating each read voltage threshold of one or more physical pages in the given page group.

9. The data storage system of claim 6, wherein:
the calibration threshold is an upper calibration threshold; and
the controller is further configured to perform:
the controller determining whether the error metric satisfies a lower calibration threshold; and
the controller skipping calibration of all physical pages in the given page group based on a determination that the error metric satisfies the lower calibration threshold.

10. The data storage system of claim 9, wherein the controller is further configured to perform:
the controller dynamically determining the lower calibration threshold based on post-calibration error metrics of calibrated page groups.

11. The data storage system of claim 6, and further comprising the non-volatile memory coupled to the controller.

12. A computer program product, the computer program product comprising a computer readable storage medium having program instructions embodied therewith, the program instructions being executable by a controller of a non-volatile memory including a plurality of physical blocks of memory each including a plurality of physical pages each assigned to one of a plurality of page groups, wherein, when executed, the program instructions cause the controller to perform:
individually adapting read voltage thresholds of each of the plurality of page groups within each of the plurality of physical blocks such that different ones of the plurality of page groups have differing read voltage thresholds and applying the respective read voltage thresholds to reads performed to physical pages belonging to each of the plurality of page groups, wherein individually adapting read voltage thresholds includes, for each given page group among the plurality of page groups:
performing a calibration read of a sample physical page of the given page group;
determining if an error metric observed for the calibration read of the sample physical page satisfies a calibration threshold; and
calibrating read voltage thresholds applicable to only physical pages in the given page group utilizing a first calibration technique based on a determination that the error metric satisfies the calibration threshold and calibrating the read voltage thresholds of the given page group utilizing a different second calibration technique based on a determination that the error metric does not satisfy the calibration threshold; and
applying a respective different calibration interval for each of the plurality of page groups within the given physical block.

13. The data storage system of claim 12, wherein:
the first calibration technique is a less resource-intensive calibration technique;
the second calibration technique is a more resource-intensive calibration technique; and
calibrating the read voltage thresholds of the given page group utilizing the first calibration technique comprises calibrating read voltage thresholds of the sample physical page and applying the calibrated read voltage thresholds of the sample physical page to all physical pages in the given page group.

14. The data storage system of claim 12, wherein:
the first calibration technique is a less resource-intensive calibration technique;
the second calibration technique is a more resource-intensive calibration technique; and
calibrating read voltage thresholds of the given page group utilizing the second calibration technique comprises individually calibrating each read voltage threshold of one or more physical pages in the given page group.

15. The data storage system of claim 12, wherein:
the calibration threshold is an upper calibration threshold; and
the program instructions further cause the controller to perform:
the controller determining whether the error metric satisfies a lower calibration threshold; and
the controller skipping calibration of all physical pages in the given page group based on a determination that the error metric satisfies the lower calibration threshold.

16. The method of claim 1, wherein:
the non-volatile memory includes a plurality of layers of integrated circuitry; and
physical pages among the plurality of physical pages are assigned to the plurality of page groups according to which of the plurality of layers the physical pages are disposed in.

17. The method of claim 1, wherein:
the plurality of physical pages includes:
a plurality of lower pages in a first page group among the plurality of page groups; and
a plurality of upper pages in a second page group among the plurality of page groups;
applying a respective different calibration interval for each of the plurality of page groups includes applying a longer calibration interval to the first page group and a shorter calibration interval to the second page group, such that the controller performs calibration more frequently for the second page group.

18. The method of claim 1, wherein applying a respective different calibration interval for each of the plurality of page groups includes:
determining the different calibration intervals for the plurality of page groups in accordance with respective probabilities of failure of physical pages in differing ones of the plurality of page groups.

19. The method of claim 1, and further comprising the controller applying a respective different calibration threshold for each of the plurality of page groups.

* * * * *